(12) United States Patent
Somasekhar et al.

(10) Patent No.: US 6,707,755 B1
(45) Date of Patent: Mar. 16, 2004

(54) HIGH VOLTAGE DRIVER

(75) Inventors: Dinesh Somasekhar, Hillsboro, OR (US); Shih-Lien L. Lu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/316,728

(22) Filed: Dec. 11, 2002

(51) Int. Cl.[7] .................................................. G11C 8/00
(52) U.S. Cl. .................................. 365/230.06; 365/203
(58) Field of Search ........................... 365/230.06, 203

(56) References Cited

U.S. PATENT DOCUMENTS

| | | |
|---|---|---|
| 5,221,867 A | 6/1993 | Mitra et al. |
| 5,815,687 A | 9/1998 | Masleid et al. |
| 6,043,696 A | 3/2000 | Klass et al. |
| 6,343,040 B2 * | 1/2002 | Bae .............................. 365/203 |
| 2003/0067833 A1 * | 4/2003 | Hong ...................... 365/230.06 |

* cited by examiner

*Primary Examiner*—Huan Hoang
(74) *Attorney, Agent, or Firm*—Blakely, Sokoloff, Taylor & Zafman LLP

(57) ABSTRACT

Domino circuits are used to drive cascode circuits in a driver circuit. An output of the driver circuit may be used to provide a high output voltage (higher than the power supply voltage) without overstressing the individual transistors in the driver circuit. In one embodiment, a protection circuit is used to prevent a short circuit between two voltage connections during a transition of the driver circuit output.

25 Claims, 7 Drawing Sheets

HIGH VOLTAGE DRIVER

BACKGROUND

1. Technical Field

An embodiment of the invention relates generally to the field of electronic circuits, and in particular relates to the field of voltage driver circuits.

2. Description of the Related Art

Under-driven word-lines or bit-lines are often employed in memories to accomplish full rail voltage swings with low leakage through memory access devices. In particular, dynamic random access memory (DRAM) designs employ under-driven word-lines to improve the retention time of storage cells by cutting down leakage through the pass transistors. For instance, with a pass transistor being employed to drive a word-line in a DRAM to Vcc, the gate of the pass transistor may be driven beyond the positive power supply rail of Vcc, strongly cutting off the pass transistor so that the word-line will not leak charge back through the pass transistor. With a higher voltage on the gate of the pass transistor than on the source (drain), leakage back through the pass device is virtually eliminated. However, the higher voltage may exceed the breakdown voltage of the individual transistors being used to drive the pass transistor. This problem is typically handled by cascode voltage switch logic (CVSL) using cross-coupled PMOS pull-up devices, and NMOS pull-down devices to cause the cross-coupled PMOS devices to switch. However, the CVSL logic typically has slow switching speeds because the pull-down NMOS devices must overcome the output of the PMOS devices to cause the output to transition. Slow switching speeds are an impediment to improving memory access times.

BRIEF DESCRIPTION OF THE DRAWINGS

The invention may be understood by referring to the following description and accompanying drawings that are used to illustrate embodiments of the invention. In the drawings.

DETAILED DESCRIPTION OF THE INVENTION

In the following description, numerous specific details are set forth. However, it is understood that embodiments of the invention may be practiced without these specific details. In other instances, well-known circuits, structures and techniques have not been shown in detail in order not to obscure an understanding of this description.

References to "one embodiment", "an embodiment", "example embodiment", "various embodiments", etc., indicate that the embodiment(s) of the invention so described may include a particular feature, structure, or characteristic, but not every embodiment necessarily includes the particular feature, structure, or characteristic. Further, repeated use of the phrase "in one embodiment" does not necessarily refer to the same embodiment, although it may.

Some of the various embodiments described herein refer to transistors driving a particular node to a voltage by connecting the node to that voltage through the transistor. As is well known in the art, a small voltage drop may be experienced through a transistor when the transistor is turned on, thus the node may be driven to a level that is approximately the same as, but slightly different than, the voltage referred to. In keeping with common industry practice when describing digital logic, all such descriptions herein should be interpreted to mean the node is driven to approximately the indicated voltage rather than to exactly the indicated voltage.

Various embodiments of the invention improve the switching time of a cascode output circuit by using fast domino logic to drive the cascode output circuit and using separate keeper circuits to hold the current state of the output circuit, rather than using cross-coupled transistors both to drive the cascode output circuit and to hold the state. In one embodiment a first domino logic circuit drives the PMOS pull-up output transistors and a second domino logic circuit drives the NMOS pull-down output transistors.

Figure 1:
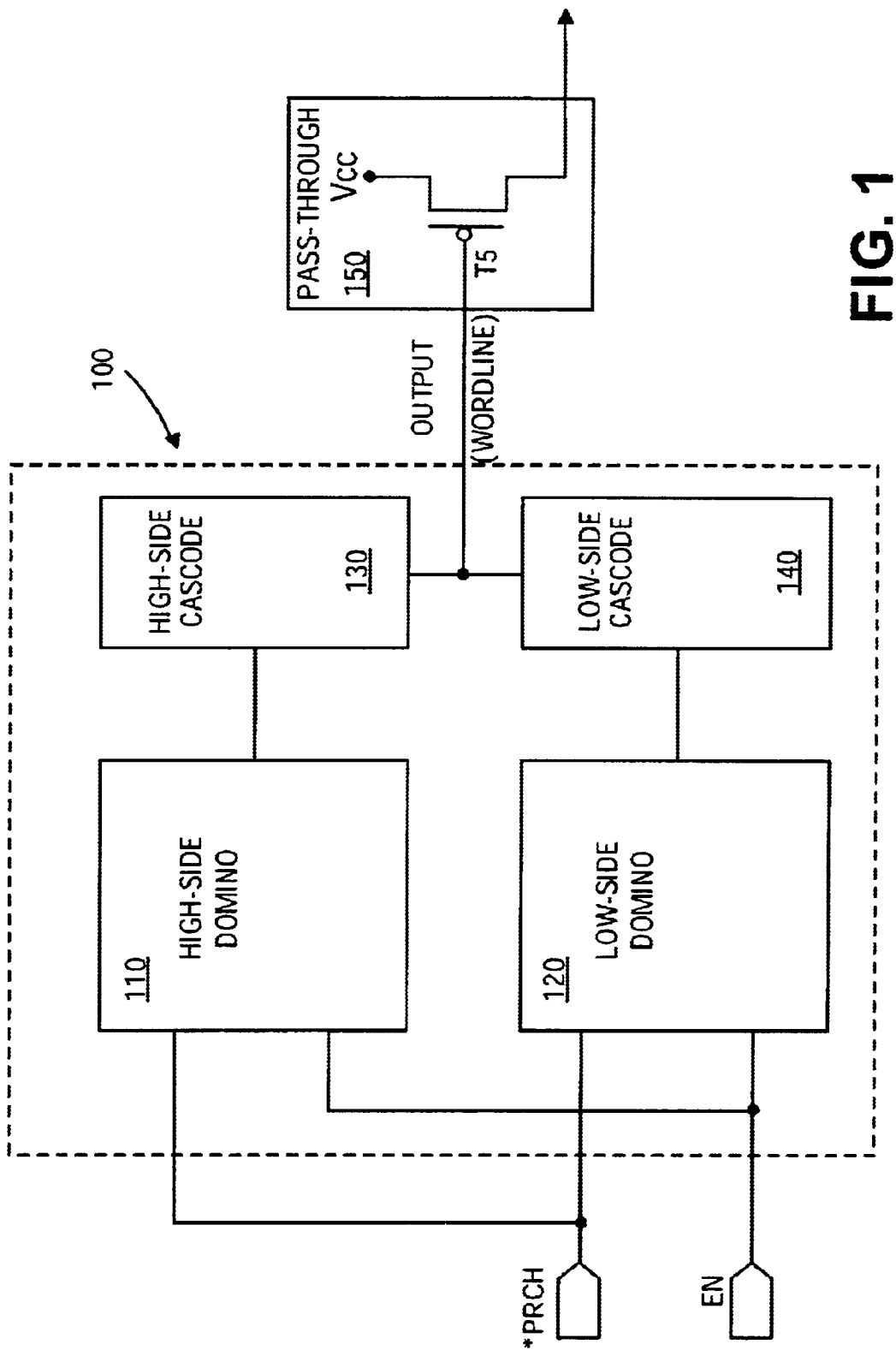
FIG. 1 shows a block diagram of a circuit, according to one embodiment of the invention.

FIG. 1 shows a block diagram of a driver circuit, according to one embodiment of the invention. In the illustrated embodiment, driver circuit 100 includes a cascode output with a high-side cascode circuit 130 (e.g., a PMOS cascode circuit) on the high side and a low-side cascode circuit 140 (e.g., an NMOS cascode circuit) on the low side, a high-side domino circuit 110 to drive the high-side cascode circuit 130, and a low-side domino circuit 120 to drive the low-side cascode circuit 140. As used herein, the terms "high-side" and "low-side" are derived from the relative voltage levels that the circuits handle, with the high-side circuits defined as using a voltage that is larger in magnitude (either positive or negative) than the low-side circuits. However, other terms may also be used to describe the circuits without deviating from the scope of the various described embodiments.

Precharge signal *PRCH and word enable signal EN provide inputs to driver circuit 100, and driver circuit 100 provides an output signal OUTPUT. The signal OUTPUT (which in some embodiments may also be referred to as a wordline signal) may drive the input of pass device ISO, turning on pass device 150. In the illustrated embodiment a single transistor T5 is shown as a pass device, but other embodiments may utilize other circuits as pass device 150. Although the terms domino, cascode, pass device, wordline, output, precharge and word enable are used to describe certain circuits and signals, other terms may be used without departing from the scope of various embodiments of the invention. For example, "word line" may refer to the line and/or signal that drives a word line input in a memory having a particular configuration of cells, but embodiments of the invention could just as easily drive a bit line, byte line, row line, column line, etc., input in other memory configurations with different descriptive labels.

Figure 2:
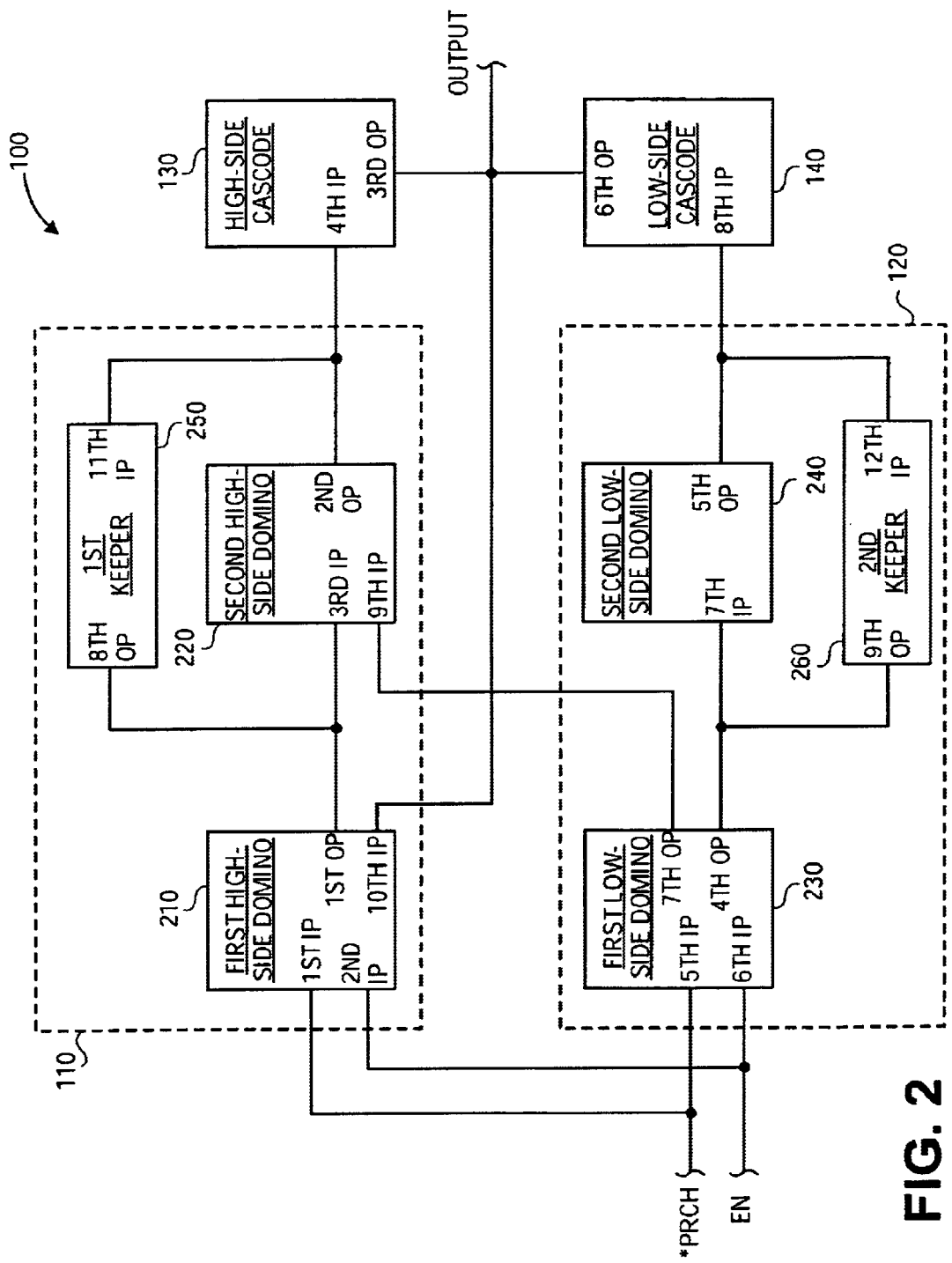
FIG. 2 shows a more detailed block diagram of the circuit of FIG. 1, according to one embodiment of the invention.

FIG. 2 shows a more detailed block diagram of the circuit of FIG. 1, according to one embodiment of the invention. In the illustrated embodiment, high-side domino circuit 110 includes a first high-side domino stage 210 that drives a second high-side domino stage 220, which in turn drives the high-side cascode circuit 130. Low-side domino circuit 120 includes a first low-side domino stage 230 that drives a second low-side domino stage 240, which in turn drives the low-side cascode circuit 140. As used herein, the term "stage" is used to represent a circuit that makes up a portion (e.g., a sub-circuit) of the larger circuits 110 and/or 120. The term stage is used only to differentiate the sub-circuits from the domino circuits 110, 120 themselves.

First keeper circuit 250 may be used to maintain the output of the second high-side domino stage 220 at a constant level upon a certain specific transition at the input nodes *PRCH, EN, and second keeper circuit 260 may be used to maintain the output of the fourth domino stage at a constant level upon the same specific transition of the input nodes. The first and second keeper circuits may thus be used together to maintain the output signal OUTPUT at a constant level under the same transition at the input nodes. The specific transition is described later in more detail. The circuits shown in FIG. 2 have various inputs labeled generically as $1^{st}$, $2^{nd}$, $3^{rd}$, etc. IP and various outputs labeled generically as $1^{st}$, $2^{nd}$, $3^{rd}$, etc. OP.

Figure 3:
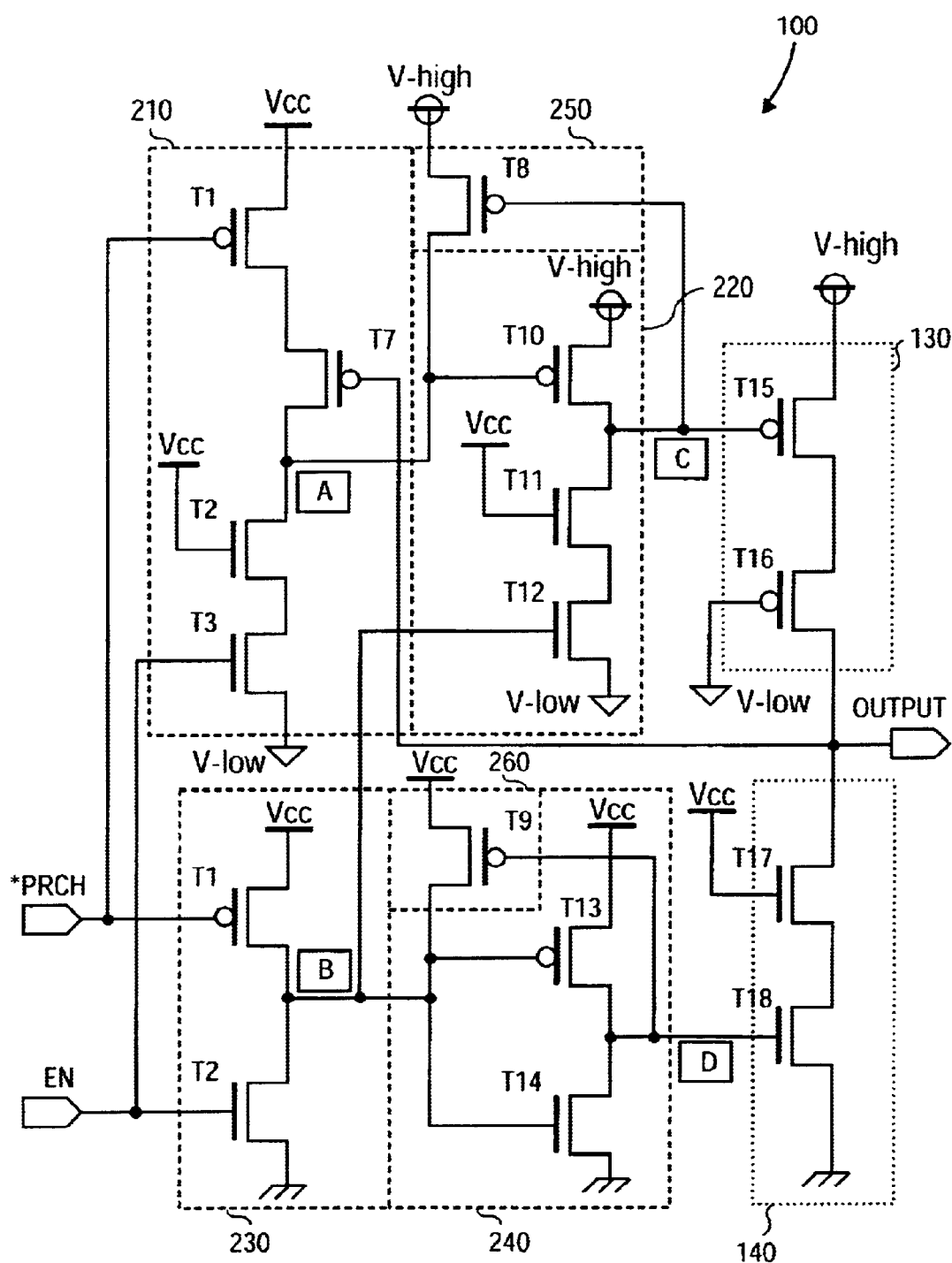
FIG. 3 shows a schematic diagram of the circuit of FIG. 2, according to one embodiment of the invention.

FIG. 3 shows a schematic diagram of the driver circuit of FIG. 2, according to one embodiment of the invention. Individual transistors are shown within the blocks that were identified in FIG. 2. In the illustrated embodiment of FIG. 3, high-side domino circuit 110 includes: 1) a first high-side domino stage 210 with PMOS transistors T1, T7, and NMOS transistors T2, T3, and 2) a second high-side domino stage 220 with PMOS transistor T10 and NMOS transistors T11, T12. First keeper circuit 250 includes PMOS transistor T8. Low-side domino circuit 120 includes: 1) first low-side domino stage 230 with PMOS transistor T4 and NMOS transistor T6, 2) second low-side domino stage 240 with PMOS transistor T13 and NMOS transistor T14. Second keeper circuit 260 includes PMOS transistor T9. High-side cascode circuit 130 includes PMOS transistors T15, T16, and low-side cascode circuit 140 includes NMOS transistors T17, T18.

In the illustrated embodiment, four voltage levels are shown that provide electrical power to various portions of the driver circuit 100. In one embodiment, these are provided through four power connections that distribute the power to the various portions of the driver circuit 100. In a particular embodiment, the four voltage levels are ground, Vcc, V-high (higher than Vcc), and V-low (lower than Vcc but higher than ground). The various transistors may be designed to handle the voltage between Vcc and ground, and to handle the voltage between V-high and V-low, but the voltage between V-high and ground may exceed the breakdown voltage of some or all of the individual transistors. Transistors T2, T11, T16 and T17 are not used as voltage switches, but are in the circuit specifically to prevent their companion transistors (T3, T12, T15 and T18, respectively) from experiencing the V-high-to-ground voltage potential which could exceed the aforementioned breakdown voltage.

In some embodiments the voltages may have other labels, and the node labeled herein as ground may have some other label (e.g., Vss) and some voltage level other than 0 volts, provided the relationships between the different voltage levels meet the requirements that 1) V-high>Vcc>V-low>Vss/ground, and that 2) the values of V-high minus V-low, and Vcc minus Vss/ground, do not exceed the breakdown voltages of the transistors to which these voltages will be applied. In a particular embodiment, Vcc is approximately 1.5 volts, V-high is approximately 2.0 volts, and V-low is approximately 0.5 volts, but other embodiments may use other voltages (e.g., Vcc=approximately 3 volts, V-high=approximately 4.5 volts, V-low = approximately 1.5 volt). In one embodiment, the difference between V-high and V-low is equal to or less than the value of Vcc. While in one embodiment the signals *PRCH, WEN, and OUTPUT represent precharge, word enable, and output signals as previously described, other embodiments may use signals with other names. In the illustrated embodiment, the prefix "*" in *PRCH indicates that the signal is asserted low and deasserted high, while a signal without such a prefix (e.g., WEN) is asserted high and deasserted low.

Figure 4A:
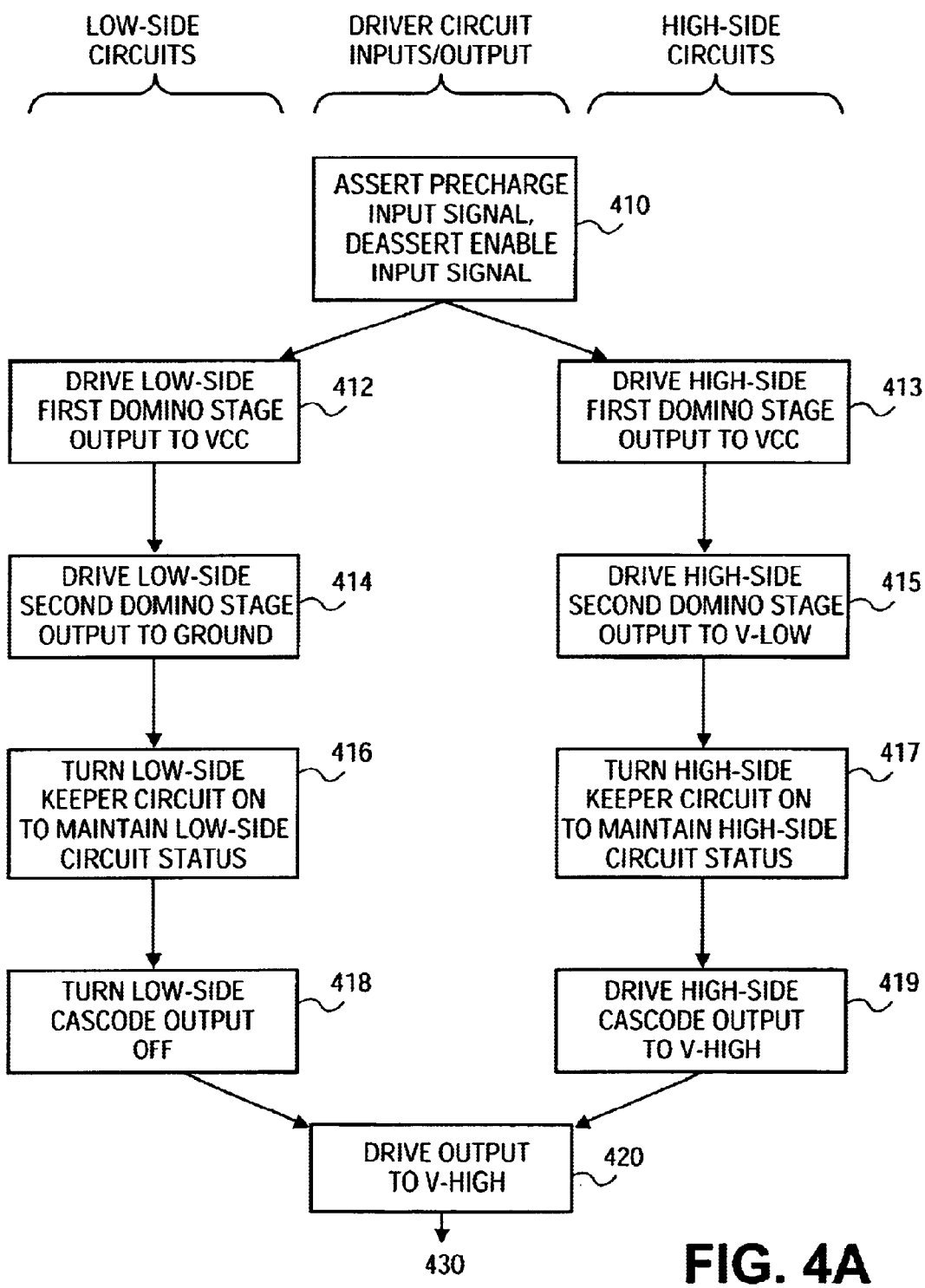
FIGS. 4A–4C show a method of operation of a circuit, according to one embodiment of the invention.
Figure 4B:
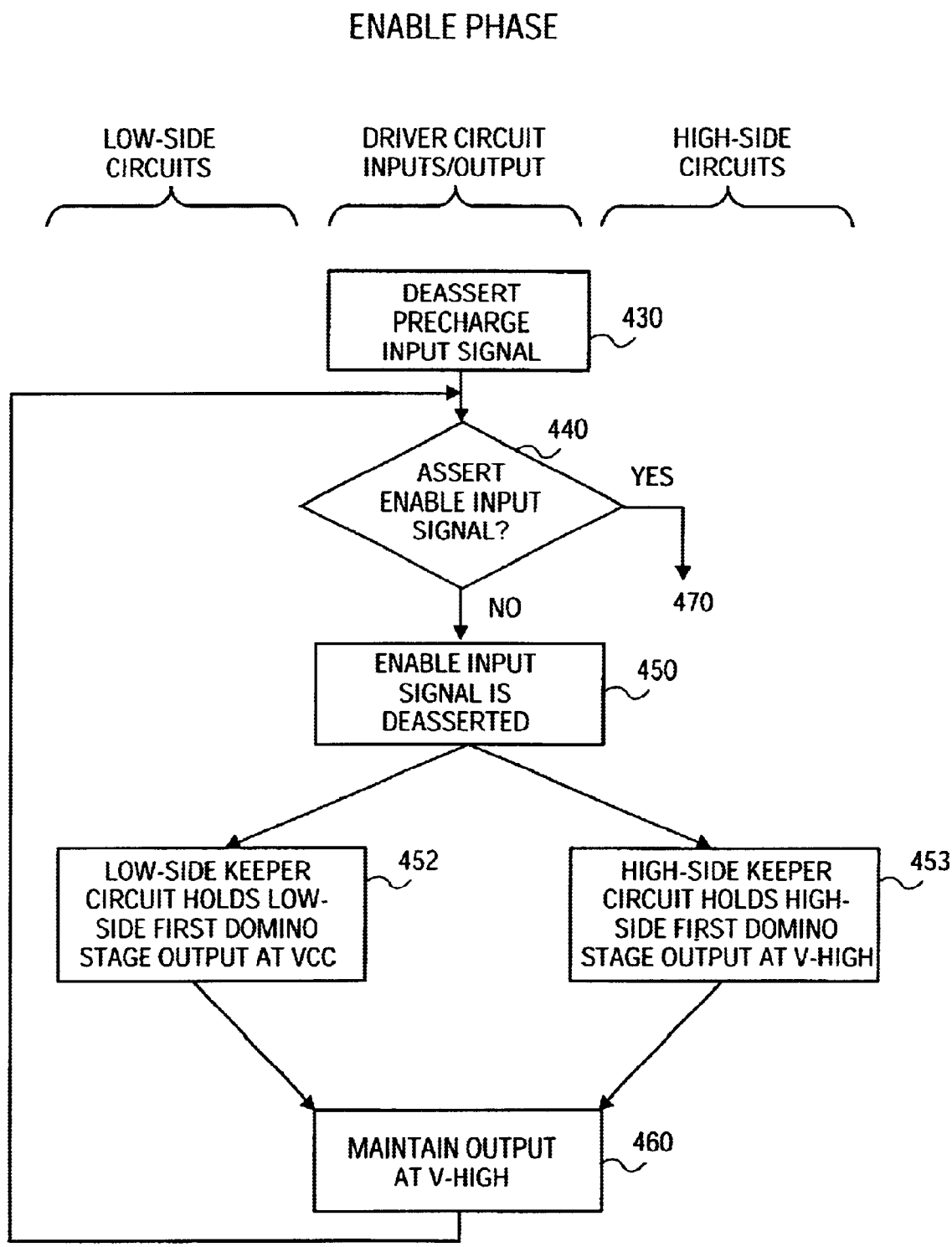
Figure 4C:
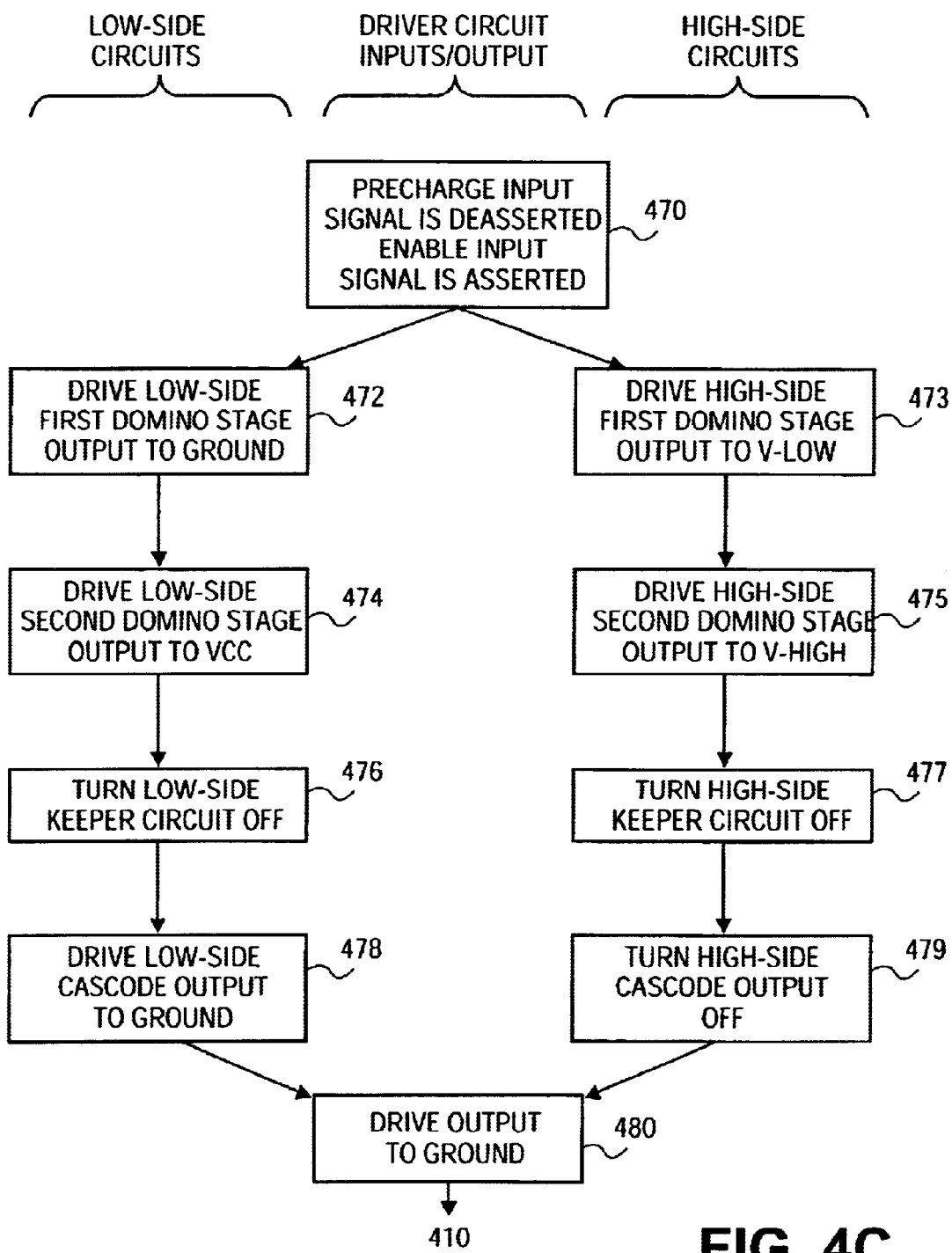

FIGS. 4A–4C show a method of operation of a circuit, according to one embodiment of the invention. Because a circuit (e.g., the circuit of FIG. 3) may have multiple actions taking place in different parts of the circuit at essentially the same time, the flow chart of FIGS. 4A–4C is divided into three columns to better illustrate the essentially parallel timing of signal flow through the circuit. The left side column refers to actions/states in the low-side domino and cascode circuits, the right side column refers to actions/states in the high-side domino and cascode circuits, and the middle column refers to actions/states at the inputs to, and output from, the overall circuit.

The following text sometimes refers to both the circuit of FIG. 3 and the method of FIGS. 4A–4C, but it is obvious that the circuit of FIG. 3 and the method of FIGS. 4A–4C may be practiced independently of each other. A precharge phase of circuit operation is shown in FIG. 4A. An enable phase of circuit operation is shown in FIGS. 4B, 4C, with two different states of an enable input producing the two different operations in the enable phase.

Referring to FIG. 4A, the precharge phase may begin with a Precharge input signal being asserted and an Enable input signal being deasserted. With reference to FIG. 3, within the signal labeling convention being used, EN corresponds to the Enable input and is asserted by being driven high and deasserted by being driven low, while *PRCH corresponds to the Precharge input, with the "*" indicating that the signal is asserted by being driven low and deasserted by being driven high. Thus the precharge phase in the circuit of FIG. 3 has *PRCH and EN both being low. This conditions turns off transistor T6 and turns on transistor T4, which drives node B (the low-side first domino stage output) to Vcc. At the same time, transistor T3 is turned off and transistor T1 is turned on. If the output signal OUTPUT is already high, T7 is turned on and connects node A (the high-side first domino stage output) to Vcc through T1. The low- and high-side first domino stages now satisfy the conditions of blocks 412 and 413 in FIG. 4A, which state that the outputs of both the low- and high-side first domino stages are driven to Vcc.

Again referring to FIG. 3, when node B is high transistor T14 is turned on while transistor T13 is turned off, thus driving node D (the low-side second domino stage output) to ground. At the same time, node B being high turns on transistor T12, driving node C (the high-side second domino stage output) to V-low. This satisfies the conditions of blocks 414 and 415 of FIG. 4A.

Blocks 416 and 417 refer to keeper circuits that maintain the status of various low- and high-side circuits. With reference to FIG. 3, transistor T9 is a low-side keeper circuit and is turned on when node D is at ground, thus connecting node B to Vcc through transistor T9. This maintains node B at Vcc (and therefore node D at ground) until transistor T6 is turned on, regardless of the state of transistor T4. In a similar manner, transistor T8 is a high-side keeper circuit and is turned on when node C is at V-low, thus connecting node A to V-high through transistor T8. This maintains node A at V-high until transistor T3 is turned on, regardless of the state of transistor T1.

With node D at ground, transistor T18 is turned off, and with node C at V-low, transistor T15 is turned on. This satisfies the conditions of block 418 (turn low-side cascode output off) and block 419 (drive high-side cascode output to V-high). Since the low- and high-side cascode outputs are tied together into a single output node (e.g., node OUTPUT in FIG. 3), this results in driving the signal at the output node to V-high as described in block 420. The circuit (e.g., driver circuit 100) may now be in a steady-state condition which will persist until one or both of the precharge and enable inputs change, at which point the flow chart continues at block 430 in FIG. 4B.

FIG. 4B shows how a change of the Precharge input signal may affect the circuit. At block 430, the Precharge input signal is deasserted, indicating the precharge phase is over and the enable phase may begin. Whether this causes the output node to change depends on whether the Enable input signal also changes by being asserted, as determined at block 440. If not, i.e., if the Enable input signal remains deasserted at block 450, the low-side keeper circuit maintains the low-side first domino stage output at Vcc at block 452 and the high-side keeper circuit maintains the high-side first domino stage output at V-high at block 453. As before, this combination results in the output node being maintained at V-high at block 460, and control returns to block 440 to await a change in the enable signal.

With reference to FIG. 3, deasserting the Precharge input signal by driving *PRCH high turns off transistors T4 and T1. But as previously described, node B is held at Vcc through keeper transistor T9 and node A is held at V-high through keeper transistor T8, so the change in T4 and T1 have no effect on the remaining circuitry and OUTPUT remains at V-high.

Returning to FIG. 4B, if the Enable input signal is determined to be asserted at block 440, control moves to FIG. 4C. With the Precharge input signal deasserted and the Enable input signal asserted as shown at block 470, the low-side first domino stage output is driven to ground at block 472 and the high-side first domino stage output is driven to V-low at block 473.

With reference to FIG. 3, when the Enable input signal EN is driven high by being asserted, transistor T6 is turned on, driving node B to ground and satisfying the condition of block 472. At the same time, driving the Enable input signal EN high turns on transistor T3, driving node A to V-low and satisfying the condition of block 473.

Returning to FIG. 4C, when the low-side first domino stage output is driven to ground at block 472, the low-side second domino stage output is driven to Vcc at block 474. This action turns off the low-side keeper circuit at block 476, thus releasing any retention effect the low-side keeper circuit may have. In a similar manner, when the high-side first domino stage output is driven to V-low at block 473, the high-side second domino stage output is driven to V-high at block 475. This action turns off the high-side keeper circuit at block 477, thus releasing any retention effect the high-side keeper circuit may have.

With reference FIG. 3, when node B goes to ground, transistor T14 is turned off and transistor T13 is turned on, disconnecting node D from ground and driving node D to Vcc through transistor T13. Since node D is the low-side second domino stage output, this satisfies the condition of block 474. When node D is driven to Vcc, transistor T9 is turned off, thus ending any effect second keeper circuit 260 may have on node B, and satisfying the condition of block 476.

At the same time, when node B is driven to ground, transistor T12 is turned off, disconnecting node C from V-low. When node A is driven to V-low, transistor T10 is turned on, connecting node C to V-high. Since node C is the high-side second domino stage output, this satisfies the condition of block 475. When node C is driven to V-high, transistor T8 is turned off, thus ending any effect first keeper circuit 250 may have on node C, and satisfying the condition of block 477.

Returning to FIG. 4C, at block 478 the low-side cascode output is driven to ground, while the high-side cascode output is turned off at block 479. Since the low- and high-side cascode outputs are connected at the output node, the output node is thus driven to ground at block 480. This represents a steady-state condition that may remain until the input signals change, at which point control may return to block 410 to begin another precharge phase.

With reference to FIG. 3, when node C is at V-high, transistor T15 is turned off, disconnecting the high-side cascode output and satisfying the conditions of block 479. When node D is at Vcc, transistor T18 is turned on, driving the low-side cascode output to ground and satisfying the condition of block 478. Since the outputs of the high- and low-side cascode circuits are connected at the OUTPUT node, this condition drives the signal at OUTPUT to ground, satisfying the condition of block 480.

When another precharge phase is to be entered, a protection circuit (e.g., transistor T7) prevents certain non-allowable conditions from occurring. When *PRCH is asserted low and EN is deasserted low, the driver circuit 100 reacts much as previously described for the precharge phase. If OUTPUT is already high, T7 is already turned off and keeper circuit T8 already holds node A at Vcc. However, if OUTPUT transitions from low to high, as it may at the beginning of a precharge phase, the following sequence of operations may happen:

A) T7 is initially on (because OUTPUT is initially low). As *PRCH goes low, it turns on T1, and node A is driven to Vcc through T1 and T7. T8 is initially off and does not affect node A.

B) Once node A starts to approach Vcc, T10 turns off so that it does not contend with T12, which begins to drive node C (the gate of T8) to V-low.

C) As the gate of T8 begins to go to V-low, T8 begins to turn on and pull node A towards V-high. Node A must go to V-high or T10 will not turn off completely.

D) As OUTPUT goes to V-high to begin the precharge phase, the gate of T7 also goes to V-high, turning off T7. This prevents Vcc from being shorted to V-high through T1, T7, and T8 at the beginning of the precharge phase.

Figure 5:
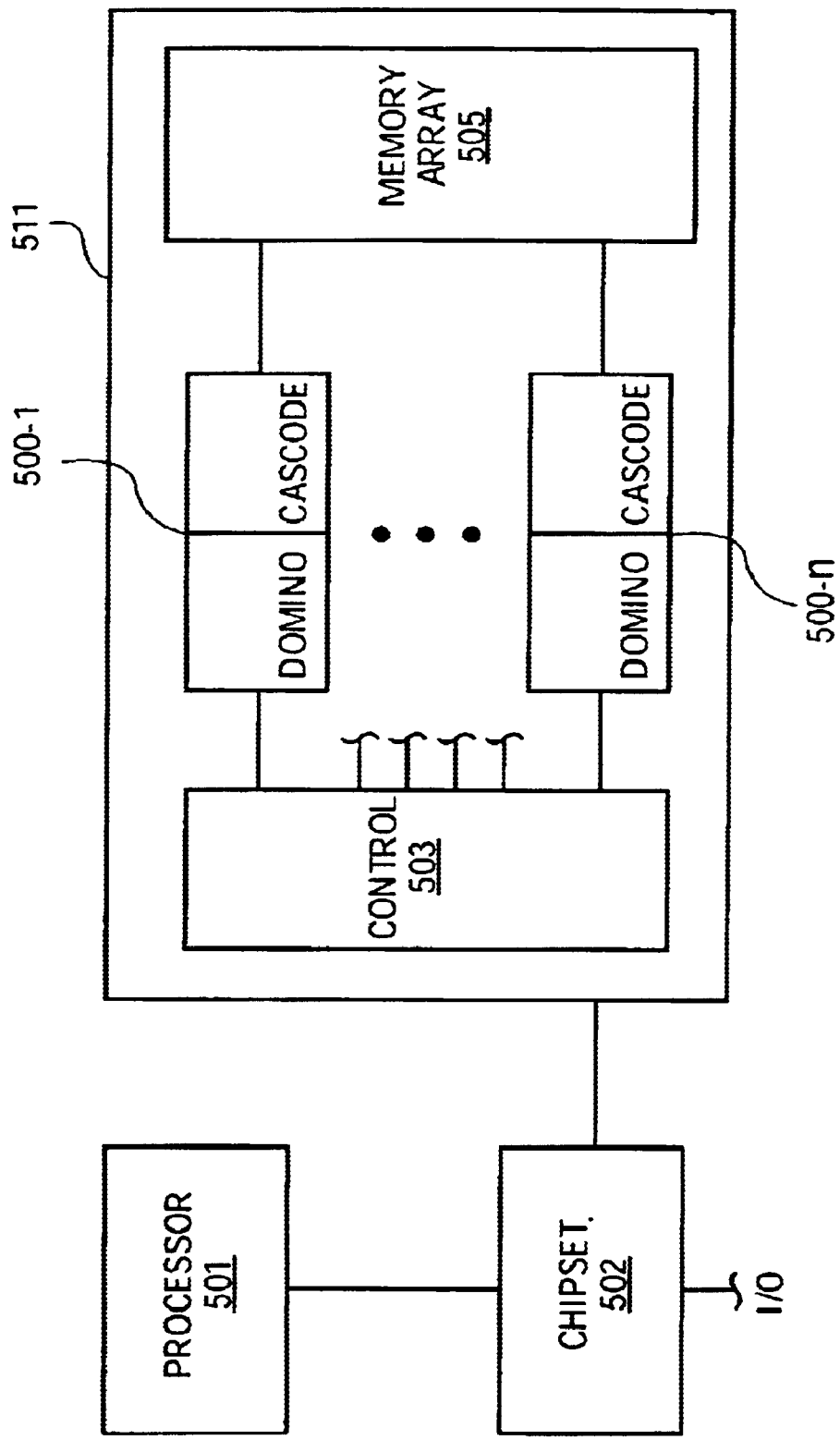
FIG. 5 shows a block diagram of a system, according to one embodiment of the invention

FIG. 5 shows a block diagram of a system, according to one embodiment of the invention. In the illustrated embodiment of FIG. 5, a memory device 511 contains a number of driver circuits 500-1 through 500-n (which may each be the same as previously described driver circuit 100), each of which may be used to drive a separate line in memory array 505. In a particular embodiment the driver circuits 500 are used to drive word-lines, but other embodiments may use driver circuits 500 to drive other types of lines (e.g., bit-lines). Each driver circuit 500 is shown with domino and cascode components, as previously described. Control logic 503 may be used to provide control signals to each driver circuit 500. In one embodiment, control logic 503 provides a precharge signal and an enable signal to each driver circuit.

The system embodiment shown in FIG. 5 also includes processor 501 to execute instructions that may result in read and/or write accesses to memory device 511. Chip set 502 is coupled between processor 501 and memory device 511 to provide an interface between memory device 511 and processor 501. Chip set 502 may also provide an interface through the I/O connection between memory device 511 and other devices that are able to initiate read and/or write operations to memory device 511. The various control circuits needed to perform read and/or write operations with memory device 511 may be located in various places (e.g., in chip set 502, in control logic 503, in both, etc.) Although labeled as a "chip set", the circuit of 502 may also be designated by other labels and terms, and may be implemented in one, two, or more integrated circuits, as well as being implemented as a part of other integrated circuits that may or may not be shown in FIG. 5.

The foregoing description is intended to be illustrative and not limiting. Variations will occur to those of skill in the art. Those variations are intended to be included in the various embodiments of the invention, which are limited only by the spirit and scope of the appended claims.

What is claimed is:

1. An apparatus, comprising:
   a high-side cascode driver circuit;
   a low-side cascode driver circuit;
   an output coupled between the high-side cascode driver circuit and the low-side cascode driver circuit to drive a pass device coupled to a memory;
   a high-side domino circuit coupled to the high-side cascode driver circuit to control the high-side cascode driver circuit;
   a low-side domino circuit coupled to the low-side cascode driver circuit to control the low-side cascode driver circuit;
   a precharge input coupled to the high-side and low-side domino circuits; and
   an enable input coupled to the high-side and low-side domino circuits.

2. The apparatus of claim 1, wherein:
   the high-side cascode driver circuit includes a PMOS transistor and the low-side cascode driver circuit includes an NMOS transistor.

3. The apparatus of claim 1, wherein:
   the high-side and low-side domino circuits each include first and second domino stages.

4. The apparatus of claim 1, further including:
   a first keeper circuit coupled to the high-side domino circuit; and
   a second keeper circuit coupled to the low-side domino circuit.

5. The apparatus of claim 1, wherein:
   the first domino circuit includes a protection circuit to prevent a short circuit between two power connections during a voltage transition at the output.

6. An apparatus, comprising:
   a first high-side domino circuit having a first input coupled to a first input node and having a second input coupled to a second input node, the first high-side domino circuit further having a first output;
   a second high-side domino circuit having a third input coupled to the first output, and further having a second output;
   a high-side cascode circuit having a fourth input coupled to the second output, and further having a third output coupled to an output node;
   a first low-side domino circuit having a fifth input coupled to the first input node and having a sixth input coupled to the second input node, the first low-side domino circuit further having a fourth output;
   a second low-side domino circuit having a seventh input coupled to the fourth output, and further having a fifth output;
   a low-side cascode circuit having an eighth input coupled to the fifth output, and further having a sixth output coupled to the output node;
   a first keeper circuit having an eleventh input coupled to the second output and an eighth output coupled to the first output; and
   a second keeper circuit having a twelfth input coupled to the fifth output and a ninth output coupled to the fourth output.

7. The apparatus of claim 6, wherein:
   the first low-side domino circuit has a seventh output coupled to a ninth input in the second high-side domino circuit.

8. The apparatus of claim 6, wherein:
   the output node is coupled to a tenth input in the first high-side domino circuit.

9. The apparatus of claim 6, further comprising:
   a first power connection to provide a first voltage, a second power connection to provide a second voltage, a third power connection to provide a third voltage, and a fourth power connection to provide a fourth voltage;
   wherein the first high-side domino circuit is coupled to the second and third power connections, the second high-side domino circuit is coupled to the first and third power connections, the high-side cascode circuit is coupled to the first and third power connections, the first low-side domino circuit is coupled to the second and fourth power connections, the second low-side domino circuit is coupled to the second and fourth power connections, and the low-side cascode circuit is coupled to the second and fourth power connections.

10. The apparatus of claim 9, wherein:
    the first voltage is greater than the second voltage, the second voltage is greater than the third voltage, and the third voltage is greater than the fourth voltage.

11. The apparatus of claim 10, wherein:
    the fourth voltage is approximately signal ground.

12. The apparatus of claim 10, wherein:
    a signal to be produced by the first and second cascode circuits at the output node includes a first state approximately equal to the first voltage and a second state approximately equal to the fourth voltage.

13. The apparatus of claim 12, wherein:
    the signal to be produced at the output node is to be in the first state responsive to a signal at the first input node being asserted and a signal at the second input node being deasserted.

14. The apparatus of claim 13, wherein:
    the signal to be produced at the output node is to remain in the first state when the signal at the first input node is deasserted and the signal at the second input node remains deasserted.

15. The apparatus of claim 14, wherein:
    the first and second keeper circuits are to keep the signal to be produced at the output node in the first state when the signal at the first input node is deasserted and the signal at the second input node remains deasserted.

16. The apparatus of claim 14, wherein:
    the signal to be produced at the output node is to change from the first state to the second state when the signal at the first input node remains deasserted and the signal at the second input node is asserted.

17. The apparatus of claim 12, wherein:

the first high-side domino circuit includes a protection circuit coupled to the output node to prevent a short circuit between the first voltage connection and the second voltage connection responsive to a transition at the output node from the first state to the second state.

18. A method, comprising:

controlling a first cascode circuit with a first domino circuit;

controlling a second cascode circuit with a second domino circuit;

driving an output node with the first and second cascode circuits to switch an output voltage at the output node between a precharge voltage and an enable voltage.

19. The method of claim 18, wherein:

the enable voltage is approximately zero volts; and the precharge voltage is higher than a circuit voltage for a memory to be controlled by the output node.

20. The method of claim 18, further comprising:

controlling the first and second domino circuits with an enable input and a precharge input.

21. A system, comprising:

a high-side cascode driver circuit;

a low-side cascode driver circuit coupled to the high-side cascode driver circuit at an output node;

a memory array;

a pass device coupled between the output node and the memory array to connect a voltage level to the memory array;

a high-side domino circuit coupled to the high-side cascode driver circuit to control the high-side cascode driver circuit;

a low-side domino circuit coupled to the low-side cascode driver circuit to control the low-side cascode driver circuit;

a first input node coupled to the high-side and low-side domino circuits;

a second input node coupled to the high-side and low-side domino circuits; and a processor to initiate memory operations in the memory array.

22. The system of claim 21, further including:

a first keeper circuit coupled to the high-side domino circuit; and a second keeper circuit coupled to the low-side domino circuit.

23. The system of claim 21, wherein:

the first domino circuit includes a protection circuit to prevent a short circuit between two power connections during a voltage transition at the output node.

24. The system of claim 21, wherein:

the pass device is a transistor.

25. The system of claim 21, wherein:

the output node is a word line in the memory array.

* * * * *

UNITED STATES PATENT AND TRADEMARK OFFICE
CERTIFICATE OF CORRECTION

PATENT NO. : 6,707,755 B1
DATED : May 16, 2004
INVENTOR(S) : Somasekhar et al.

It is certified that error appears in the above-identified patent and that said Letters Patent is hereby corrected as shown below:

Column 2,
Line 45, delete "ISO", insert -- 150 --.

Signed and Sealed this

Twelfth Day of April, 2005

JON W. DUDAS
*Director of the United States Patent and Trademark Office*